United States Patent [19]
Covington, Jr.

[11] 3,950,710
[45] Apr. 13, 1976

[54] WIDE BAND, IN-LINE, MICROWAVE AMPLIFIER

[75] Inventor: Martin B. Covington, Jr., Monkton, Md.

[73] Assignee: The Bendix Corporation, Southfield, Mich.

[22] Filed: Dec. 17, 1970

[21] Appl. No.: 99,196

[52] U.S. Cl. .................................... 330/49; 330/53
[51] Int. Cl.[2] ........................................... H03F 3/60
[58] Field of Search .............. 330/53 C, 44, 47, 49; 315/5.14, 5.16, 5.26, 39.3, 3.6

[56] References Cited
UNITED STATES PATENTS

| | | | |
|---|---|---|---|
| 2,122,538 | 7/1938 | Potter | 330/49 |
| 2,225,447 | 12/1940 | Haeff et al. | 315/5.14 |
| 2,233,126 | 2/1941 | Haeff | 315/5.26 |
| 2,546,993 | 4/1951 | Ferguson | 330/46 |
| 2,647,175 | 7/1953 | Sheer | 330/49 |
| 2,808,470 | 10/1957 | Hansell | 330/44 |
| 2,840,647 | 6/1958 | Koros et al. | 330/49 X |
| 3,022,443 | 2/1962 | Fowler | 315/39.3 |
| 3,389,295 | 6/1968 | Pietrzyk | 315/3.6 |

Primary Examiner—James B. Mullins
Attorney, Agent, or Firm—W. G. Christoforo; Bruce L. Lamb

[57] ABSTRACT

A wide band, in-line, microwave amplifier having a large gain bandwidth product includes a coaxial tetrode located within a cavity. High gain in a relatively short active section of the amplifier results from close placement of the tetrode control grid to the centrally located cathode. Wide bandwidth is afforded by constant dimensional relationships along the transmission section of the device and by matching the impedance of the device to the load fed by the device.

3 Claims, 8 Drawing Figures

INVENTOR
MARTIN B. COVINGTON, JR.

BY
William G. Christoforo
ATTORNEY

INVENTOR
MARTIN B. COVINGTON, JR.

BY
William G. Christoforo
ATTORNEY

INVENTOR
MARTIN B. COVINGTON, JR.

BY
William G. Christoforo
ATTORNEY

WIDE BAND, IN-LINE, MICROWAVE AMPLIFIER

BACKGROUND OF THE INVENTION

This invention relates to wide band, in-line, microwave amplifiers having a high gain and more particularly to such amplifiers using tetrode or triode vacuum tubes as the active element.

Tetrode and triode microwave amplifiers have two outstanding advantages over other amplifier types for high power applications such as use in a microwave transmitter:

1. phase stability and linearity
2. economy Likewise, tetrode and triode amplifiers suffer two major limitations:
   1. low gain-bandwidth product
   2. high power not consistent with high frequency.

The phase stability and linearity of these amplifiers is a direct result of the short electrical length of the tetrode or triode vacuum tube used as the active element therein. The inherent economic advantage results from the absence of any magnetic field and the fact that the tuned circuitry of the vacuum tube is external to the tube. This allows replacement of the active portion of the amplifier without the necessity of discarding the tuned circuit. Also, since the tube does not contain any internal tuning mechanism, it automatically is a much more versatile device and thus has other potential economic advantages.

An amplifier of the type described which permits in-line use of the amplifier has the further advantage of being easily interposed in the transmission line between the transmitter and the load, which in the case of a phased array radar is an antenna element. This in-line arrangement is convenient and economical as to space.

In view of the inherent advantages of tetrode and triode microwave amplifiers over other amplifier devices, it is not surprising that efforts have been made to improve their performance with regard to gain-bandwidth product and power-frequency limitations. These have included attempts to increase the transconductance of the vacuum tube or to decrease the shunt output capacitance in order to improve the figure of merit of the device. Distributed amplifiers have also been developed in which part or all of the output capacitance is employed in an artificial delay to improve the gain-bandwidth product.

SUMMARY OF THE INVENTION

This invention extends the basic distributed amplifier concepts to microwave tubes as suggested by the internal construction of conventional coaxial negative grid tubes. In these tubes, each pair of adjacent electrodes plus the intervening gap therebetween represent a section of coaxial transmission lines with an associated characteristic impedance. This invention teaches the proper termination of the input and output transmission lines to the amplifier in order to produce the ultimate distributed amplifier.

In the amplifier to be described, RF energy enters from one end and travels along the transmission line, within the vacuum tube, comprised of the cathode-grid structure. This wave is terminated by a load represented by the cathode current. The current which enters the grid-plate region induces a traveling wave in the coaxial output transmission line which proceeds to the load. Output energy is prevented from traveling toward the input by means of a quarter wavelength short. This quarter wave short is the predominant bandwidth limitation of the device when operated below frequencies at which transit time is appreciable. By choice of a proper quarter wave shorting device, bandwidths of an octave are possible. Wider bandwidths are possible by loading both ends of the vacuum tube with equal loads. The dimensions of the wave transmission path through the amplifier are designed to present an amplifier impedance which is matched to the load impedance for maximum bandwidth.

The active length of the amplifier is approximately one-eighth wavelength to ensure proper phase relation between the input and output voltages along the length of the amplifier. The active length must also be limited to assure a reasonably constant input voltage along the input section.

An object of this invention is thus to provide a new means for amplifying microwaves.

Another object of this invention is to provide an in-line microwave amplifier.

One more object of this invention is to provide an amplifier of the type described having a high gain-bandwidth product.

Still another object of this invention is to provide an amplifier of the type described which affords high gain to microwave energy passing therethrough.

It is a further object of this invention to provide an amplifier of the type described which has a relatively short active section.

Still a further object of this invention is to provide an in-line microwave amplifier having a constant impedance along its transmission length, which impedance is matched to an output load.

These and other objects of the invention will become apparent with a reading and understanding of the following specification and claims.

DESCRIPTION OF THE PREFERRED EMBODIMENT

Figure 1:
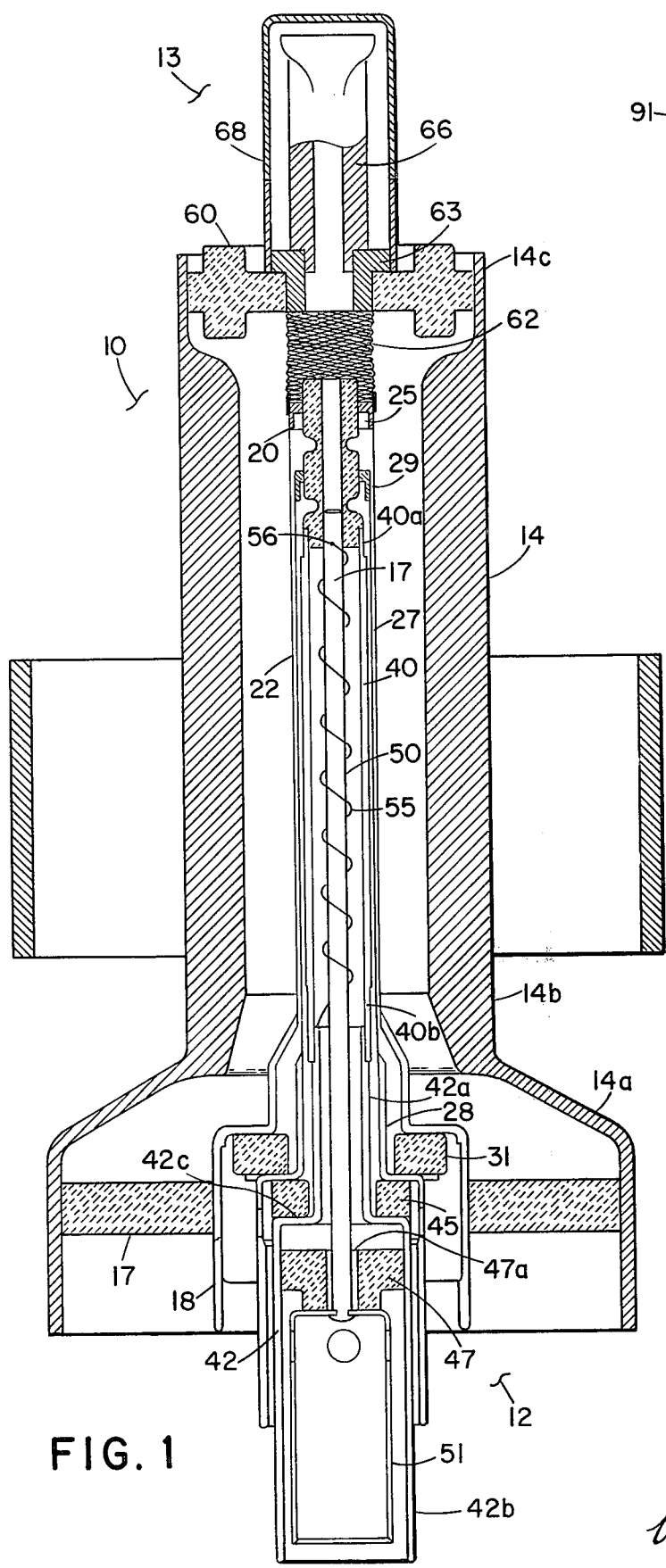
FIG. 1 shows the internal constructon of a coaxial tetrode vacuum tube suitable for use in the invention.
Figure 3:
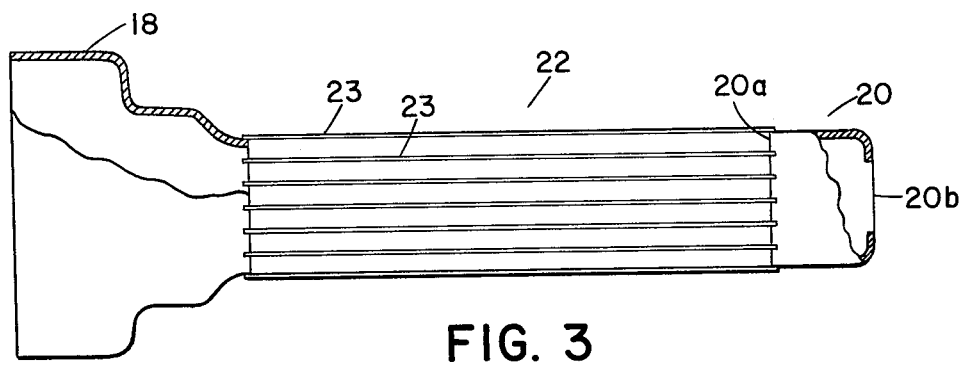
FIG. 3 shows in greater detail the screen grid used in the vacuum tube of FIG. 1.

Referring first to FIG. 1 which is a cross sectional view of the coaxial tetrode vacuum tube, generally designated at 10, suitable for use in the invention, and which includes a input end 12 and output end 13. It can be seen that the tetrode is a vacuum tube which differs from most vacuum tubes in that it has external electrodes on both ends. The plate structure, 14, has a hollow bell shaped input end 14a, a hollow regular cylindrical midsection 14b, which coincides with the active portion of the tube and a hollow cylindrical output section 14c having external screen grid and plate terminals. A disc shaped vacuum seal 17 having a central bore and made of a material which is transparent to microwave energy, such as a ceramic of the type well known to those skilled in the art, has its outer diameter vacuum sealed to the internal surface of input end 14a and its inner diameter vacuum sealed to the external surface of screen grid end 18. The screen grid is seen in greater detail in FIG. 3, reference to which should now be made. The screen grid is made up of first end 18, generally of a self-supporting configuration, and a pan shaped second end 20 having an open end 20a and a centrally located bore 20b in its bottom end. A plurality of grid wires 23 are stretched between ends 18 and 20 and welded thereto at their extremities. Ends 18 and 20 are made of electrically conductive materials and are configured as surfaces of revolution.

Returning now to FIG. 1 it can be seen that end 20 is loose fit at bore 20b to the outside diameter of a ceramic spacer 25 which is centrally located along the longitudinal axis of the tube. The loose fit allows for temperature changes during operation of the amplifier.

Figure 2:
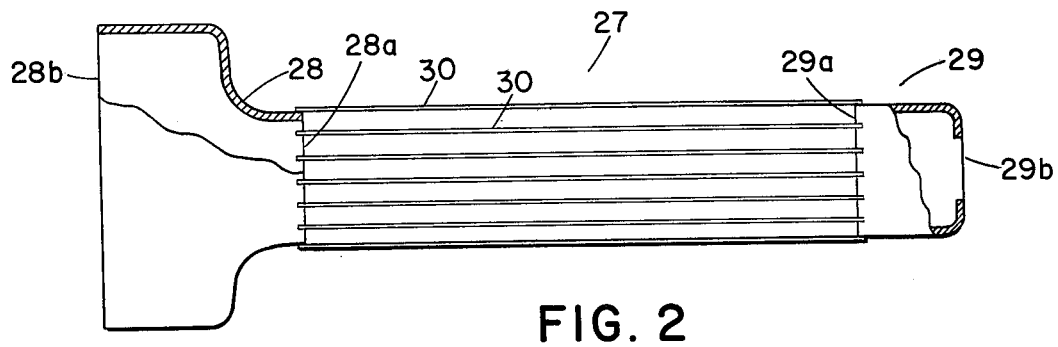
FIG. 2 shows in greater detail the control grid used in the vacuum tube of FIG. 1.

Located centrally of the screen grid is a control grid 27 having a first end piece 29 and an opposite second end piece 28. The control grid is seen in greater detail in FIG. 2, reference to which figure should now be made. End piece 28 is a hat shaped surface of revolution having open ends 28a and 28b. End piece 29 is also a pan shaped surface of revolution having an open end 29a and a centrally located bore 29b at its bottom. As was the case with the screen grid, a plurality of grid wires 30 are stretched between end pieces 28 and 29 and welded thereto at their extremities.

Returning to FIG. 1 there is seen that end piece 29 is loose fit onto ceramic spacer 25 through bore 29b while end 28 is sealed vacuum tight to end 18 through annularly shaped ceramic spacer 31. It can be seen that end piece 28 is coaxial with end piece 18 and bell shaped plate section 14a.

A hollow cylindrical cathode structure 40 is located coaxial with and inward of the screen and control grids. One end 40a of the cathode is attached to spacer 25 while cathode end 40b is supported by contact structure 42. Contact structure 42 is a surface of revolution having an upturned cylindrical section 42a supporting end 40b, a down-turned section 42b and an intermediate shoulder section 42c. Shoulder 42c is vacuum sealed to a similar shoulder on control grid end piece 28 through a second annularly shaped ceramic seal 45. Another ceramic seal 47 having a centrally located bore 47a seals the inside of end 42b.

A rigid conductive rod 50 located on the longitudinal axis of the tube has one end tightly fitted into spacer 25 for lateral support of the spacer and another end passing through and sealed to hole 47a and attached to cylindrical contact 51. The interface of contact 51 with spacer 47 is also vacuum sealed. A heating wire 55 is attached at end 56 to conductive rod 50. The heating wire winds about the conductive rod towards the input end of the tube where it is attached to the cathode support structure 42. Plate section 14c is vacuum sealed by annularly shaped ceramic seal 60 which has a T-shaped cross section to suppress current leakage thereacross. The seal has a central bore to which an extension of the screen grid is sealed. The extension consists of hollow cylinder 63, sealed to the bore, and a flexible wire mesh 62 connected in the area where the cylinder enters the tube. Wire mesh 62 is also connected to and supported by end 20 of the screen grid and is sufficiently flexible to allow expansion of the screen grid and other tube elements during operation of the amplifier. A pump-out tubulation 66 makes contact with cylinder 63 and completes the vacuum sealing of the vacuum tube. A contact cap 68 covers the pump-out tubulation and makes electrical contact therewith.

Suitable cooling fins 70 surround and make suitable thermal contact with plate midsection 14b.

In operation of the tube, filament power is supplied to contact 51 and rod 50 to end 56 of heater 55 with the filament power return through cathode contact structure 42. The incoming wave to be amplified is applied between contacts 42b and 28, that is, between the cathode and the control grid. The amplified wave is taken off at the output end 13 between plate section 14c, and end cap 68, that is, between the plate and screen grid of the tube.

The active section of the tube is in that tube length where the cathode is overlaid by the control grid, which is designed to be approximately one eighth wavelength long. Since the cathode is not resistively terminated at end 40a, cathode currents not dissipated in their travel along the cathode are reflected from that end back into the main body of the cathode. However, since the active section of the tube is short, the reflective currents are essentially in phase with the incoming currents and do not upset the operation of the tube.

Figure 4:
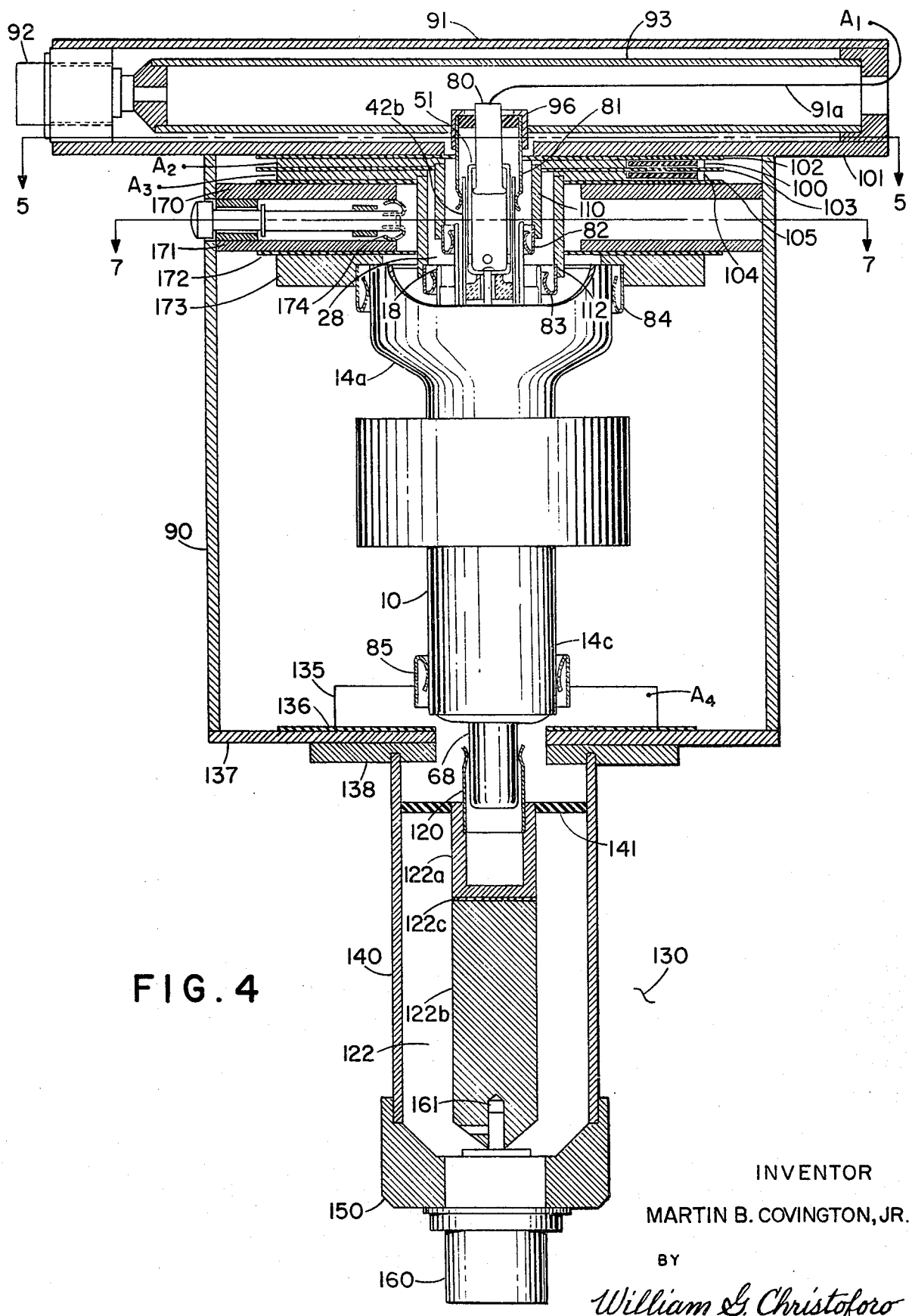
FIG. 4 is a sectional view of the coaxial amplifier of the invention, including the vacuum tube of FIG. 1.

Referring now to FIG. 4 there is seen a vacuum tube 10 mounted in a cavity 90. Filament contact 51 receives power from probe 80 which is connected to one side of a suitable voltage source $V_1$ via line 91. Crowned configured flexible finger contacts 81, 82, 83, 84 and 85 encircle and make contact with, respectively, cathode contact 42b, control grid end 28, screen grid end 18, plate input end 14a and plate output end 14c. Cavity 90 includes an input cavity section 91 which operates as an input coupling transformer between the input energy received in an input coaxial connector 92 and the vacuum tube. Input connector 92 is a standard coaxial connector, for example, a BNC or type N connector whose outer shell is connected to the walls of cavity section 91 and whose central contact is connected to tubular conductor 93.

Figure 5:
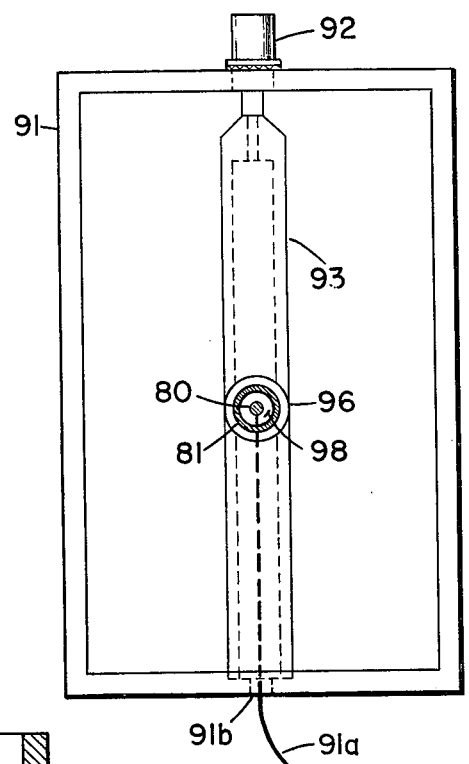
FIG. 5 is a sectional view taken through the input transformer of the coaxial amplifier of FIG. 4.

FIG. 5, which is a view taken along section 5—5 of FIG. 4, shows a cavity section 91 in greater detail. Reference to this latter figure should now be made. Cavity 91 is seen to be a boxed shaped cavity having a central conductor consisting of the tube conductor 93. A metalic cup shaped structure 96 makes contact with conductor 93 and supports within it contact 81. An ammunarly shaped washer within contact 81 and within cup 96 suports at its inner bore filament contact 80. Filament power supply lead 91a enters the cavity and conductor 93 through hole 91b and makes contact with the filament contact.

Returning now to FIG. 4 it can be seen that a direct electrical contact is made from the center conductor of connector 92 through cylindrical conductor 93, cup 96 and contact 81 to cathode contact 42b.

As previously mentioned contact to the screen grid is made through electrical contact 82 which in turn is supported by cylindrical conductive section 110 connected to conductive plate 100. These latter elements are seen in greater detail in FIG. 6, reference to which should now be had. In this figure, item 100 is seen to be a generally round metallic plate having an upstanding centrally located hollow cylindrical section 110 which supports electrical connector 82.

Returning now to FIG. 4, it can be seen that plate 100 is isolated from the rest of the cavity structure with respect to d.c. currents by insulators 102 and 103. The structure consisting of plate 100 and the top plate 101 of cavity section 91 together with insulator 102 interposed therebetween comprise a capacitor for coupling R.F. energy from cavity section 91 onto the control grid. Additionally, plate 100 is connected to a d.c. source (not shown) $V_2$ to thus apply a d.c. voltage to the control grid.

Figure 6:
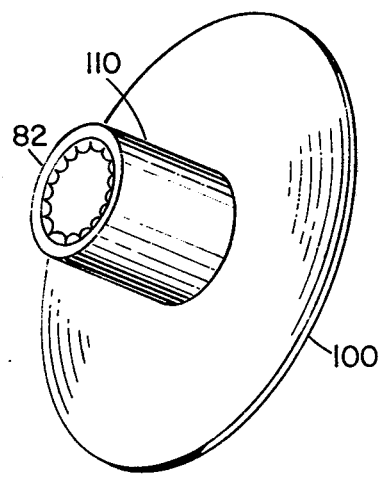
FIG. 6 shows a typical connector plate assembly of the coaxial amplifier of FIG. 4.

Contact 83, upstanding cylindrical section 112 and plate 104 comprise an assembly similar to that shown in FIG. 6. In this case, plate 104 is connected to another d.c. voltage source $V_3$ (not shown so as to d.c. supply the screen grid. It can be seen that plate 104 is connected to another d.c. voltage source $V_3$ (not shown) so as to d.c. supply the screen grid. It can be seen that plate 104 is d.c. current isolated by insulators 103 and 114. It will be remembered that the screen grid comprises the inner conductor of the transmission line for the output signal. It will also be remembered that the output end of the screen grid is terminated in end cap 68. The end cap is connected by a crown shaped flexible finger contact 120 to the inner conductor 122 of an output transformer section 130. A hollow cylindrical tube 140 makes up the outer conductor of the output transformer. This tube is electrically connected to metallic plate 138 and wall 137 of main cavity 90. The tube plate structure is connected through contact 85 to metallic plate 135. Another d.c. source $A_4$ (not shown) is connected to metallic plate 135 for the tube plate structure. A thin electrical insulator 136 is interposed between plate 135 and wall 137. This combination of plate 135, wall 137 and insulator 136 comprise a capacitor which isolates d.c. currents on the tube plate structure and capacitively couples output wave energy to outer conductor 140. Outer conductor 140 is terminated in an end cap 150 having a central bore into which is installed an output coaxial fitting 160 whose outer connector is electrically connected to the end cap and whose inner-conductor 161 is connected to transformer inner connductor 122. Inner conductor 122 is positioned within outer conductor 140 by annularly shaped insulating disc 141 which acts as a window to microwave energy. Inner conductor 122 includes the two collinear cylindrical sections 122a and 122b capacitively coupled for R.F. conduction by insulating plate 122c which isolates the screen grid d.c. currents.

It can be seen that the tube replacement can be easily effected by the simple removal of cavity plate 137 to thus expose the interior of cavity 90 and tube 10.

Figure 7:
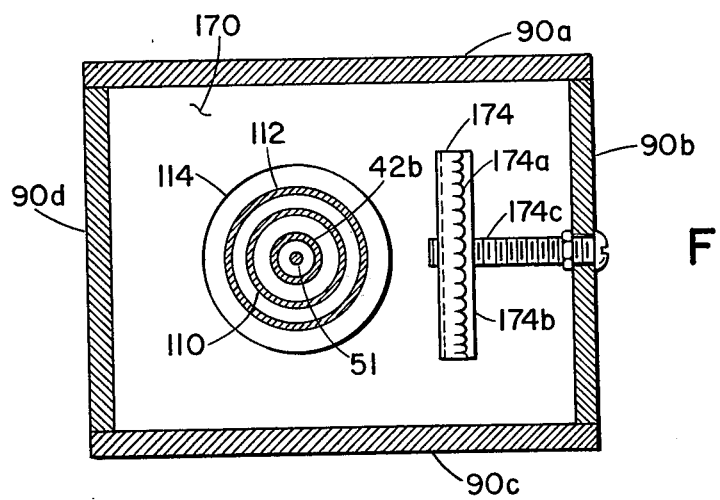
FIG. 7 is a sectional view taken through the turning cavity of the coaxial amplifier of FIG. 4.

As previously mentioned, at the tube input end, the bell shaped plate section 14a makes electrical connection through contact 84 to metallic plate 173. An insulating plate 172 isolates plate 173 with respect to d.c. currents. Plate 173, insulator 172 and plate 171, which is a top conductive plate of a tuning subcavity, comprise a capacitor for capacitively coupling tube plate microwave energy to the tuning subcavity. The tuning subcavity is enclosed by the walls of cavity 90, plates 171 and 170 and upstanding cylindrical section 112. It will be remembered that the upstanding section 112 is electrically connected to the screen grid and hence is a continuation of the amplified output signal transition line inner conductor. A tuning slug 174 is provided for tuning the subcavity. The subcavity is seen in greater detail in FIG. 7, reference to which should now be made. FIG. 7 is the section 7—7 taken in FIG. 4. In this figure it is seen that the tuning subcavity is generally rectangular in cross-section enclosed by cavity walls 90a, 90b, 90c and 90d and having a base comprised of plate 170. Plate 170 includes centrally located hole 114 through which extends the upstanding sections 112 and 110 together with cathode contact 42b and filament probe contact 51. Tuning stub 174 includes the flexible finger contact material 174a attached to bar 174b. This bar includes a threaded hole through which passes threaded slug 174c which may be manipulated from outside the cavity to effect movement of the stub, in a manner well known to those skilled in the art, to tune the cavity. The tuning subcavity is sized and tuned so that it, together with the vacuum tube 10 from the center of its active section, comprises a quarter wavelength shorting stub, for the output wave transmission line.

Figure 8:
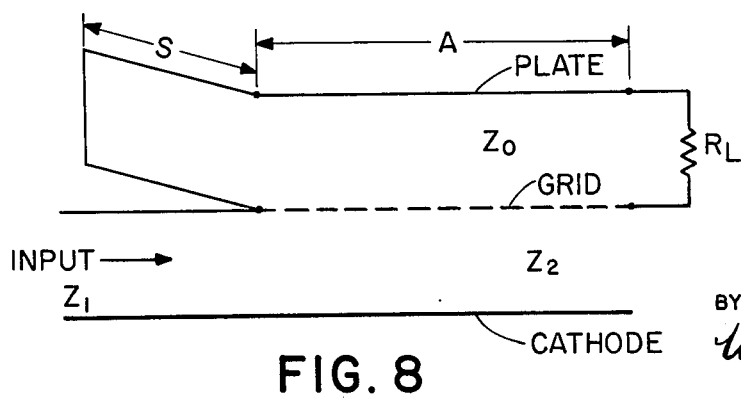
FIG. 8 is a mathematical model of the invention suitable for circuit analysis of the invention.

A mathematical model of the amplifier is shown in FIG. 8, reference to which should now also be made. A triode is shown for clarity even though the actual amplifier described above uses a tetrode to minimize the effects of transit time. In the triode the control grid is both the outer conductor of the input transmission line and the inner conductor of the output transmission line whereas in the tetrode the control grid is the outer conductor of the input transmission line and the screen grid is the inner conductor of the output transmission line. The active cathode length of the amplifier, A, is made as short as practicable, suitably approximately one-eighth wavelength. The characteristic impedance of the output active area, $Z_0$, is chosen to be matched to the load, $R_L$, referred to the end of the active tube area. The input line characteristic impedance, $Z_1$, is suitably chosen with consideration of the input transmission line and is matched to the impedance between the cathode and grid in the active tube area, $Z_2$, to permit optimum transfer of current across the interelectrode space and eventually to the plate. $Z_2$ is made as small as possible by spacing the grid as close as practical to the cathode. By proper matching of the input impedances and considering the short, active cathode length wherein currents reflected from the end of the cathode are essentially in-phase with the incoming currents, essentially all of the input energy will be used to produce cathode current and this current will flow to the output transmission line. In certain cases it may be desirable to provide a resistive element between the cathode and grid at the output end of the cathode structure. This, of course, will prevent reflection of an input current at the end of the grid but will result in the loss of some input power.

The output transmission line is terminated at its backward end by a shorting stub having a length S, suitably approximately a quarter wavelength. The current generated by the input traveling wave enters the screen grid-plate transmission line. This current generates two traveling waves in the grid-plate transmission line; one to the right and one to the left. The total current at the load is the vector sum of each increment of the current traveling wave to the right. Output energy is prevented from traveling to the left by a proper termination. This termination can be either the aforementioned shorted stub or a resistive termination depending on the bandwidth requirement for the tube. As previously discussed the shorted stub will be the element limiting the bandwidth of the tube but will require the dissipation of essentially no energy. The resistive termination, on the other hand, will result in power dissipation but will result in an amplifier of wider bandwidth.

The invention claimed is:

1. Means for amplifying the energy of an input frequency wave comprising:
   a plurality of electrodes coaxial and in spaced relation with one another; a second pair of said electrodes being the conductors of a transmission line having a characteristic impedance;
   means for applying said input wave to a first pair of said electrodes for propagation along said electrodes; and,
   load means for terminating said transmission line, said load means having an impedance essentially equal to said characteristic impedance, said electrodes being coextensive with one another and extending in the direction of propagation of said input frequency wave about one-eighth wavelength of said input frequency wave.

2. Amplifying means as recited in claim 1 wherein said transmission line is terminated by a quarter wavelength shorting stub at an end opposite said load means.

3. Means for amplifying the emergy of an input frequency wave comprising:
   a plurality of electrodes coaxial and in spaced relation with one another whereby current flows in the interelectrode space, a first pair of said electrodes being the conductors of a first transmission line having a first characteristic impedance essentially equal to the impendance represented by the interelectrode current, a second pair of said electrodes being the conductors of a second transmission line;
   means for applying said input wave to said first pair of electrodes for propagation therealong; and,
   output means connected to said second pair of electrodes, said electrodes being coextensive with one another and extending in the direction of propagation less than one wavelength of said input wave.

* * * * *